(12) United States Patent
Hol et al.

(10) Patent No.: US 7,224,429 B2
(45) Date of Patent: May 29, 2007

(54) LITHOGRAPHIC APPARATUS, DEVICE MANUFACTURING METHOD AND POSITIONING SYSTEM

(75) Inventors: Sven Antoin Johan Hol, Eindhoven (NL); Edwin Johan Buis, Belfeld (NL); Patricia Vreugdewater, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 233 days.

(21) Appl. No.: 10/964,818

(22) Filed: Oct. 15, 2004

(65) Prior Publication Data
US 2005/0146698 A1 Jul. 7, 2005

(30) Foreign Application Priority Data
Oct. 17, 2003 (EP) .................... 03078282

(51) Int. Cl.
G03B 27/42 (2006.01)
G03B 27/58 (2006.01)
G03B 27/62 (2006.01)
H02K 41/00 (2006.01)

(52) U.S. Cl. .................... 355/53; 355/72; 355/75; 310/12

(58) Field of Classification Search ................ 355/53, 355/72–76; 310/10–15; 318/135
See application file for complete search history.

(56) References Cited

U.S. PATENT DOCUMENTS

| 6,262,797 B1 * | 7/2001 | Horikawa .................... 355/53 |
| 6,750,571 B2 * | 6/2004 | Tominaga et al. ............ 310/12 |
| 6,753,534 B2 * | 6/2004 | Novak et al. .......... 250/442.11 |
| 2002/0074516 A1 | 6/2002 | Novak et al. |
| 2003/0155820 A1 | 8/2003 | Tominaga et al. |

FOREIGN PATENT DOCUMENTS

| EP | 1001512 A2 | 5/2000 |
| EP | 1267209 A1 | 12/2002 |
| EP | 2003-88088 A | 3/2003 |

* cited by examiner

*Primary Examiner*—Henry Hung Nguyen
(74) *Attorney, Agent, or Firm*—Pillsbury Winthrop Shaw Pittman, LLP

(57) ABSTRACT

A lithographic apparatus includes a positioning system including a first and second electromagnetic actuator. Each actuator includes two mutually co-operating electromagnetical elements which are movable with respect to one another due to force acting on the elements of the respective actuator. At least one of the actuators includes a shield configured to shield the actuator from a field generated by the other actuator. In this manner, a disturbance force due to the field is prevented to act on the shielded actuator. The invention also includes a positioning system including such actuators.

25 Claims, 5 Drawing Sheets

LITHOGRAPHIC APPARATUS, DEVICE MANUFACTURING METHOD AND POSITIONING SYSTEM

PRIORITY INFORMATION

This application claims priority from European Patent Application No. 03078282.5, filed Oct. 17, 2003, the content of which is herein incorporated by reference in its entirety.

BACKGROUND

1. Field of the Invention

The invention relates to a lithographic apparatus, a device manufacturing method and a positioning system.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Conventional lithographic apparatus include so-called steppers, in which each target portion is irradiated by exposing an entire pattern onto the target portion at once, and so-called scanners, in which each target portion is irradiated by scanning the pattern through the beam of radiation in a given direction (the "scanning"-direction) while synchronously scanning the substrate parallel or anti-parallel to this direction.

Conventional lithographic apparatus generally include positioning systems that are configured to position one or more elements of the apparatus. These elements can be, for example, a (part of an) illumination system, a (part of a) support structure, a (part of a) substrate table or any other suitable constituting element of the lithographic apparatus. The positioning systems frequently include a plurality of actuators, e.g. separate actuators for different directions, however it is also possible that two or more actuators are applied for a same direction, e.g. an actuator for a course, long stroke positioning and an actuator for a fine, short stroke positioning. Also, one or more of the actuators can function as a gravity compensation to compensate forces acting on parts of the lithographic apparatus due to gravity.

Frequently, the actuators make use of a magnetic actuator, such as linear motor, a magnetic gravity compensator, a motor (e.g. a voice oil or Lorentz actuator) etc.

However, a field generated by one of the actuators, such as a magnetic or electromagnetic field, may act on another one of the actuators, the actuators thus influencing each other. The field generated by the one of the actuators in its operative condition may result in a force acting on the other one of the actuators, and thus in a disturbance or error of the other one of the actuators.

SUMMARY

Embodiments of the invention include an apparatus and a method for increasing accuracy of a lithographic apparatus.

According to an embodiment of the invention, there is provided a lithographic apparatus including an illumination system for providing a beam of radiation; a support structure for supporting a patterning device, the patterning device serving to impart the beam of radiation with a pattern in its cross-section; a substrate table for holding a substrate; and a projection system for projecting the patterned beam onto a target portion of the substrate, the lithographic apparatus including a first and a second electromagnetic actuator each comprising two mutually cooperating (such as interacting) electromagnetic elements which are movable with respect to one another due to a force acting on the elements of the respective actuator, the force being caused by a field generated by the actuator, wherein at least one of the actuators includes a shield for shielding the one of the actuators from a second field generated by the other one of the actuators or generated by another magnetic part of the apparatus, for at least partly preventing a disturbance force due to the second field from acting on the one of the actuators.

A lithographic apparatus in accordance with an embodiment of the invention includes an illumination system configured to condition a beam of radiation; a support structure configured to support a patterning device, the patterning device serving to impart the beam of radiation with a pattern in its cross-section; a substrate table configured to hold a substrate; a projection system configured to project the patterned beam onto a target portion of the substrate, and a first and a second electromagnetic actuator, each of the first and second electromagnetic actuators including two electromagnetic elements that are configured to electromagnetically cooperate to move a first of the two electromagnetic elements with respect to a second of the two electromagnetic elements, wherein the first actuator includes a shield that is configured to shield the first actuator from an electromagnetic field generated by the second actuator or generated by another magnetic part of the apparatus so as to at least partly inhibit a disturbance force due to the electromagnetic field from acting on the first actuator.

A lithographic apparatus in accordance with another embodiment of the invention includes an illumination system configured to condition a beam of radiation; a support structure configured to support a patterning device, the patterning device serving to impart the beam of radiation with a pattern in its cross-section; a substrate table configured to hold a substrate; a projection system configured to project the patterned beam onto a target portion of the substrate, and a first and a second electromagnetic actuator, each of the first and second electromagnetic actuator including two electromagnetic elements that are configured to electromagnetically cooperate to move a first of the two electromagnetic elements with respect to a second of the two electromagnetic elements, wherein the first actuator includes a shield that is configured to shield the first actuator from an electromagnetic field generated by the second actuator or generated by another magnetic part of the apparatus so as to at least partly inhibit a disturbance force due to the electromagnetic field from acting on the first actuator, and wherein the first and second electromagnetic actuators are cooperable with the substrate table to enable movement of the substrate table.

A lithographic apparatus in accordance with an embodiment of the invention includes an illumination system configured to condition a beam of radiation; a support structure configured to support a patterning device, the patterning device serving to impart the beam of radiation with a pattern in its cross-section; a substrate table configured to hold a substrate; a projection system configured to project the patterned beam onto a target portion of the substrate, and a first and a second electromagnetic actuator, each of the first and second electromagnetic actuator including two electromagnetic elements that are configured to electromagnetically cooperate to move a first of the two electromagnetic elements with respect to a second of the two electromagnetic elements wherein the first actuator includes a shield that is configured to shield the first actuator from an electromagnetic field generated by the second actuator or generated by another magnetic part of the apparatus so as to at least partly inhibit a disturbance force due to the electromagnetic field from acting on the first actuator, and wherein the first and second electromagnetic actuators are cooperable with the support structure to enable movement of the support structure.

Due to the shield, it is at least partly prevented that an actuator is subjected to a field generated by the other one of the actuators or by another (moving or not moving) magnetic part, such as a ferromagnetic or electromagnetic part, and thus that a disturbance force due to the field acts on the one of the actuators. The shield may reduce a strength of the field in a relevant part of the one of the actuators, the field being generated by the other one of the actuators. Due to the reduction of this field in the one of the actuators, the influence of the field on the electromagnetic elements of the one of the actuator may be reduced, and consequently the force acting between the elements of the one of the actuators due to this field may be reduced. Further, the shielding at least partly prevents the shielded actuator from disturbing its surrounding.

The shielding may be applied for, e.g., shielding electronic circuits from electromagnetic interference. According to an embodiment of the invention, however, the shielding is used to at least partly prevent a force from acting on an actuator, the force being caused by a field generated by an other actuator and vice versa.

The electromechanical elements advantageously include one or more of a group including a coil, a permanent magnet, a metal, a ceramic and a plastic for coating.

It will be appreciated that the actuator including the two mutually cooperating electromechanical elements can include any combination of such elements which leads to a configuration in operation creating a force acting between the respective elements of such actuator.

The shield can include a ferromagnetic material, such as a steel or a material having a high relative permeability ($\mu$). In an embodiment of the invention, the material has a permeability value greater than about 50,000, in the range from about 50,000 to 200,000. An advantage is that such material provides an effective shielding while e.g. a steel is easy to fabricate and can easily be used in so called "clean" environments. Further, a saturation of is high, which has proven to be advantageous. With a material having a high relative permeability, a shielding may be improved, a value of the relative permeability greater than about 50,000 and not more than 200,000 has proven to be advantageous, as it provides effective shielding while largely avoiding a saturation of the shielding material.

Advantageously, at least one of the electromagnetic actuators includes a coaxial assembly of the two mutually cooperating electromagnetic elements, the shield being coaxial with the assembly and located at a distance from the coaxial assembly. When, the shield is located coaxial with the coaxial assembly of the electromagnetic elements, this provides for an effective shielding, as the shield effectively reduces a strength of the field to be shielded in an annular space between the two mutually co-operating electromagnetic elements.

In an embodiment of the invention, the distance is in the range from about 10 mm to 50 mm, or from 20 mm to 40 mm, the coaxial assembly having an outer diameter in the range from about 50 mm to 100 mm. In an embodiment of the invention the outer diameter is substantially 80 mm. In an embodiment of the invention, a dimension of the shield is in a same order of magnitude as a dimension of the actuators.

In an embodiment of the invention, the shield includes at least one substantially circular plate or sleeve. The substantially circular plate or sleeve has proven to provide adequate results with an actuator which includes a coaxial assembly of elements. In the case of the circular plate, the plate is advantageously located coaxial with the assembly and at a distance therefrom, while in case that the shield includes a sleeve, the sleeve is advantageously located coaxial and surrounding at least a part of the actuator.

In an embodiment of the invention, a diameter of the shield is approximately equal to a diameter of the coaxial assembly. For optimum shielding, the sleeve may include a plate closed end at an end facing the other one of the actuators. Alternatively, the shield can have any other suitable form, such as a box or a circular plate.

Advantageously, the shield or a part thereof may mechanically be connected to one of the mutually co-operating electromechanical elements. As the shield is mechanically connected to one of the mutually co-operating electromechanical elements, the shield moves, upon movement of the respective electromechanical element, with that element. Alternatively, it is possible that the shield, or shields are located fixedly, and thus do not move with one or more of the co-operating elements, when these elements move. By suitably selecting a set up in which one ore more shields move or do not move with one or more of the elements, a balance can be found between an effective shielding on the one hand which mostly requires a movement of the shield with one or more of the elements, and an avoidance of providing extra forces on a stator or mover of the actuator, which will be due to movements of the shield.

A device manufacturing method according to an embodiment of the invention includes: providing a substrate; providing a beam of radiation using an illumination system; using a patterning device to impart the beam of radiation with a pattern in its cross-section; projecting the patterned beam of radiation onto a target portion of the substrate; providing a first and a second electromagnetic actuator each including two mutually cooperating electromagnetic elements which are movable with respect to one another due to a force acting on the elements of the respective actuator, the force being caused by a field generated by the actuator, for at least partly positioning one or more of a group including the substrate, the illumination system, and the patterning device or any other structure cooperating with one or more of the group, and shielding one of the actuators from a second field generated by the other one of the actuators or generated by another magnetic part, for at least partly preventing a disturbance force due to the second field from acting on the one of the actuators.

A device manufacturing method in accordance with an embodiment of the invention includes projecting a patterned beam of radiation onto a target portion of the substrate, positioning an object with a first electromagnetic actuator, the first electromagnetic actuator including two electromagnetic elements that are configured to electromagnetically cooperate to move a first of the two electromagnetic elements with respect to a second of the two electromagnetic elements, and shielding the first actuator from an electromagnetic field generated by a second actuator or generated by another magnetic part so as to substantially inhibit a disturbance force due to the electromagnetic field from acting on the first actuator.

A positioning system according to an embodiment of the invention includes a first and a second electromagnetic actuator each comprising two mutually cooperating electromagnetic elements which are movable with respect to one another due to a force acting on the elements of the respective actuator, the force being caused by a field generated by the actuator, wherein at least one of the actuators includes a shield for shielding the one of the actuators from a second field generated by the other one of the actuators or generated by another magnetic part, for at least partly preventing a disturbance force due to the second field from acting on the one of the actuators.

A positioning system in accordance with an embodiment of the invention includes a first and a second electromagnetic actuator, each of the first and second electromagnetic actuators including two mutually cooperating electromagnetic elements that are configured to electromagnetically cooperate to move a first of the two electromagnetic elements with respect to a second of the two electromagnetic elements wherein the first actuator includes a shield that is configured to shield the first actuator from an electromagnetic field generated by the second electromagnetic actuator or generated by another magnetic part so as to at least partly inhibit a disturbance force due to the electromagnetic field from acting on the first actuator.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
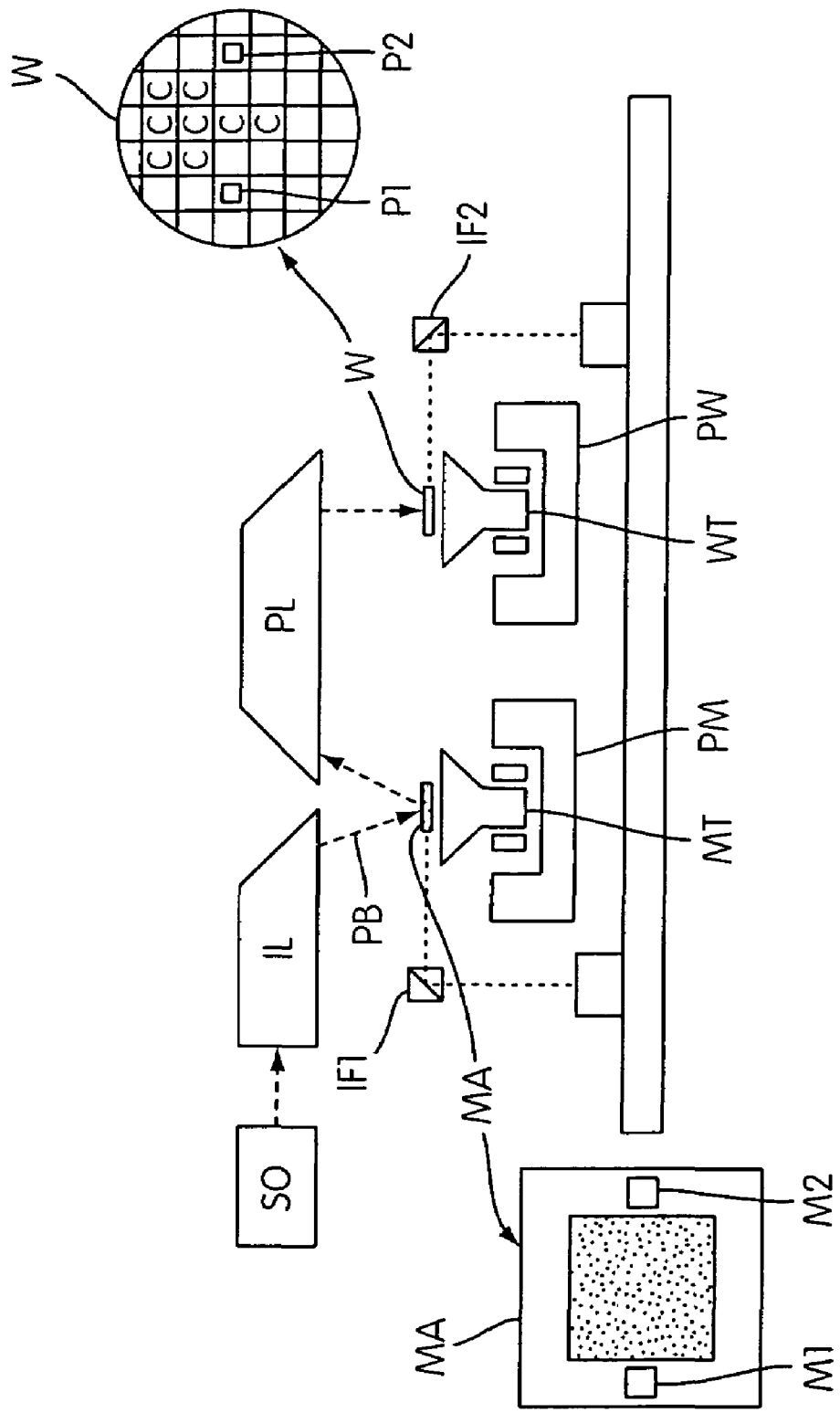
FIG. 1 depicts a lithographic apparatus in accordance with an embodiment of the invention.

FIG. 1 schematically depicts a lithographic apparatus according to an embodiment of the invention. The apparatus includes an illumination system (illuminator) IL configured to condition a beam PB of radiation (e.g. UV or EUV radiation) and a first support structure (e.g. a mask table) MT configured to support a patterning device (e.g. a mask) MA and connected to a first positioning device PM configured to accurately position the patterning device with respect to the projection system ("lens"), item PL. The apparatus also includes a substrate table (e.g. a wafer table) WT configured to hold a substrate (e.g. a resist-coated wafer) W and connected to a second positioning device PW configured to accurately position the substrate with respect to the projection system ("lens"), item PL, the projection system (e.g. a reflective projection lens) PL being configured to image a pattern imparted to the beam of radiation PB by patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector including for example suitable collecting mirrors and/or a spectral purity filter. In other cases, the source may be integral part of the apparatus, for example when the source is a mercury lamp. The source SO and the illuminator IL, may be referred to as a radiation system.

The illuminator IL may include an adjusting device configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the beam of radiation PB, having a desired uniformity and intensity distribution in its cross-section.

The projection beam PB is incident on the mask MA, which is held on the mask table MT. Being reflected by the mask MA, the beam of radiation PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

Step mode: the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

Another mode; the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
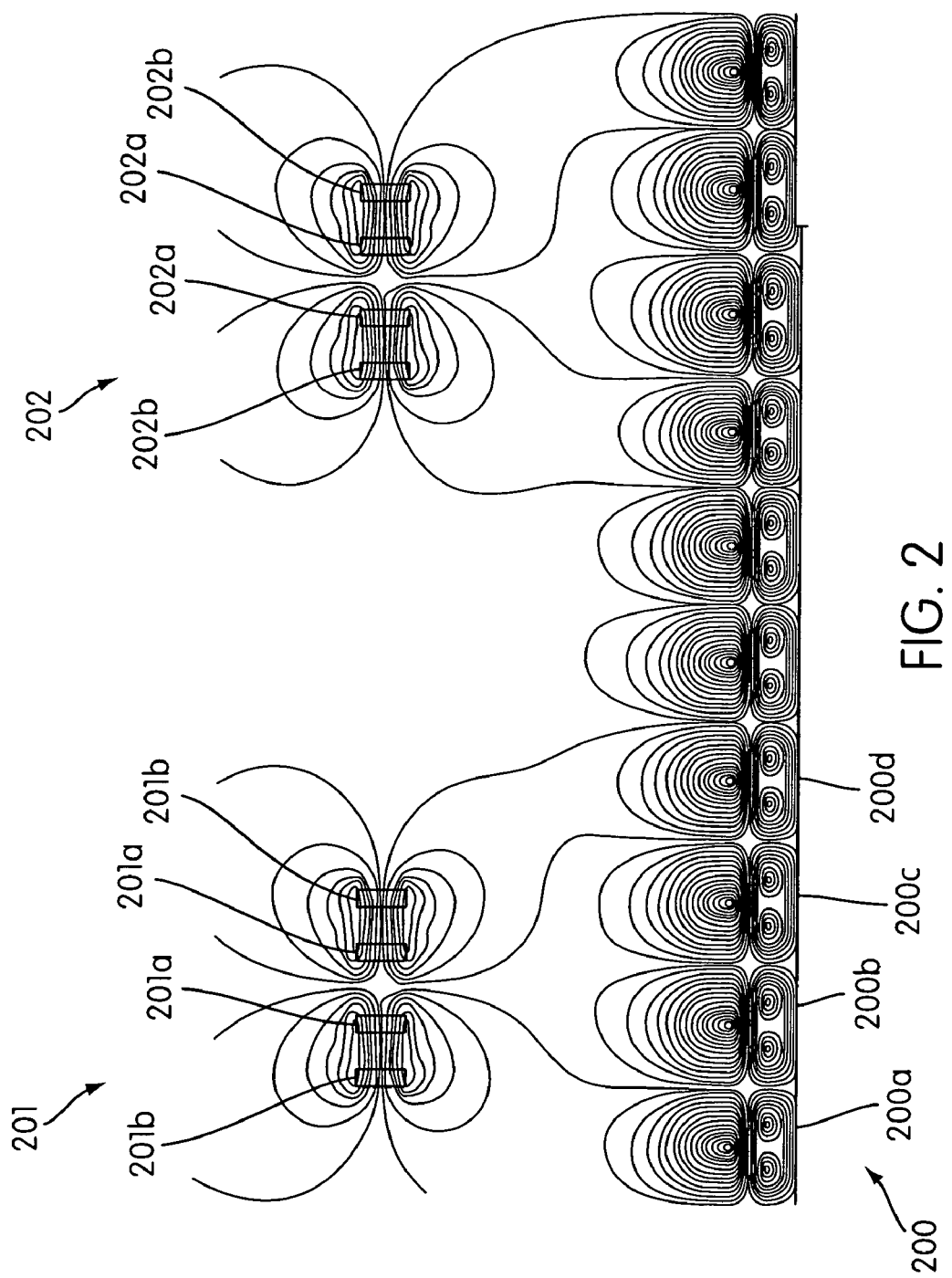
FIG. 2 depicts a cross sectional view of a positioning actuators of the lithographic apparatus according to FIG. 1, in accordance with an embodiment of the invention.

FIG. 2 shows a schematic representation of a part of a positioning system that may be arranged in the lithographic apparatus according to FIG. 1. The positioning system includes a long stroke positioner 200, and two short stroke positioners, 201 and 202. Of the long stroke positioner 200, an array of permanent magnets 200a, 200b, 200c, ... have been shown. The magnets form one of the co-operating electromagnetical elements of the long stroke actuator 200, and co-operate with another electromagnetical element (not shown) to form a linear motor in a manner known by the person skilled in the art. Of the short stroke actuator 201, 202, a cross sectional view of annular elements is shown. The actuator 201 includes a first annular magnetic element 201a and a second annular magnetic element 201b co-operating with the first annular element 201a. For clarity purposes, it is indicated that the cross sectional view of the actuators 201 and 202 is taken along the line II—II according to FIG. 3.

Further, it will be appreciated that the elements of the actuators are each mechanically connected to a respective structure, thus, when the actuator initiates a movement of the elements of the actuator with respect to each other, a movement of the respective structures with respect to each other is initiated. The respective elements of an actuator, such as the elements 201a and 201b are able to move with respect to each other due to a field (in this embodiment a magnetic field or electromagnetic field) or interacting fields between the respective elements. Due to the field, a force between the respective elements of the actuator results. Thus, element 201b is movable with respect to element 201a, element 202b is movable with respect to element 202a and a second element (not shown) of the long stroke actuator 200 is movable with respect to the array of permanent magnets 200 forming the other element of the long stroke actuator.

As schematically shown in FIG. 2, each of the actuators 200, 201, 202 generates a field, as schematically indicated in FIG. 2 by respective field lines. However, a field from one of the actuators (e.g. the long stroke actuator 200) may have an effect on one or more of the short stroke actuators 201, 202. As a consequence, due to the field generated by the long stroke actuator 200, a field may result in one or more of the short stroke actuators 201, 202 which may result in a force between the respective elements of the respective short stroke actuator, i.e. between the elements 201a and 201b of the actuator 201 and the elements 202a and 202b of the actuator 202. This force may result in a position error, acceleration error, or any other position related disturbance in the respective short stroke actuator 201, 202, thus reducing accuracy of the positioning of the respective structures connected to the respective elements of the respective actuator.

Figure 3A:
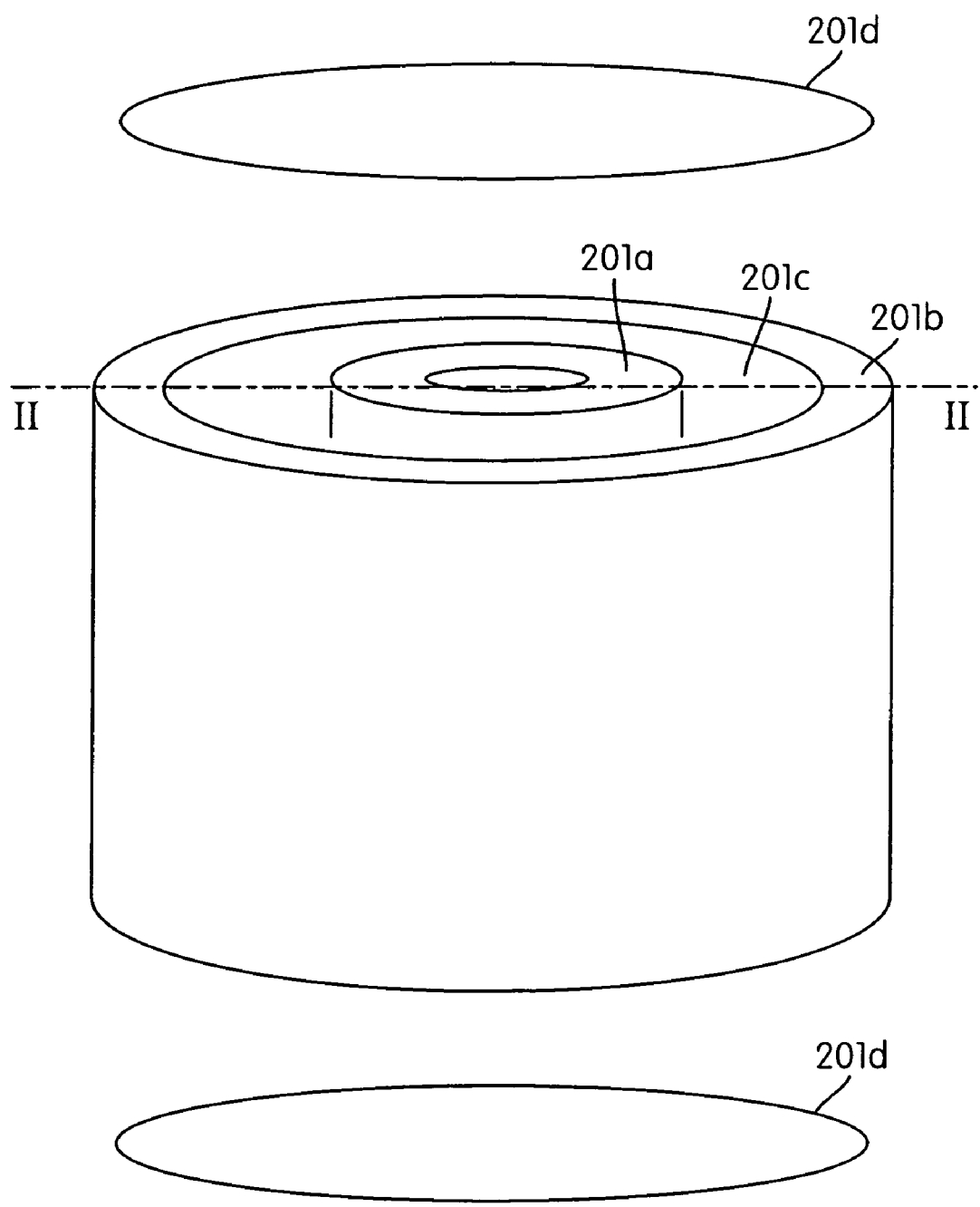
FIG. 3a and FIG. 3b depict a detailed, perspective view of an actuator according to FIG. 2, in accordance with an embodiment of the invention.

According to an embodiment of the invention, as will now be explained with reference to FIG. 3, the short stroke actuator 201 and 202 is provided with a shield that is configured to prevent the field of the long stroke actuator 200 from entering a zone 201c between the respective elements 201a and 201b, or at least diminishing a strength of the field of the actuator 200 in this zone. To this end, the actuator 201 includes shielding plates 201d which are positioned on a distance with respect to the axial element 201a and 201b.

In an embodiment of the invention, the shielding plates 201d are positioned axially with respect to the elements of the actuator and are of a circular shape. A diameter of the shielding plates 201d is, in an embodiment of the invention, substantially equal to or somewhat larger than a diameter of the respective actuator or at least not substantially smaller than an inner diameter of the outer element 201a of the actuator. The shielding plates can include a ferromagnetic material, such as a steel providing effective shielding with a commonly used material or a material having a high relative permeability. In an embodiment of the invention, the material has a relative permeability above 50,000. In another embodiment of the invention, the material has a relative permeability between 50,000 and 200,000.

The distance from the respective shields 201d to an end of the coaxial assembly of elements 201a and 201b may be from about 10 mm to 50 mm in an embodiment of the invention. In another embodiment, such a distance may be from about 20 mm to 40 mm. The coaxial assembly may have an outer diameter from about 50 mm to 100 mm, in an embodiment of the invention, or approximately 80 mm, in another embodiment of the invention.

In an embodiment of the invention, the shield 201d or one of the shields 201d can be connected to one of the elements 201a, 201b, such that when the respective element moves, the respective shield 201d moves simultaneously. In another embodiment of the invention, one of the shields 201d may be connected to the element 201a while the other one of the shields 201d is connected to the element 201b. In this manner, it may be possible to minimize a load impedance on the actuator 201 due to minimization of movement of the shields 201d with respect to the movement of the respective elements 201a, 201b of the actuator, while simultaneously providing an effective shielding in all positions of the actuators, as one of the shields may move with the element in one embodiment of the invention. Thus, in case that for example the lower element 201d is mechanically connected to the outer coaxial element 201b of the actuator 201, a distance from the outer coaxial element 201b to the lower shield 201d may be constant when the outer element 201b moves with respect to the inner element 201a. Thus, an effect of the shielding by the lower shielding plate 201d may virtually be independent of a position of the outer element 201b. In this example, the shield 201d can be mechanically connected such that it moves with the outer element 201b, however can also be connected to move with the inner element 201a. It is possible that one of the elements of the actuator moves, i.e. the other one being stationary, however it is also possible that, depending on the construction in which the actuator is comprised, that the two elements move with respect to each other.

Figure 3B:
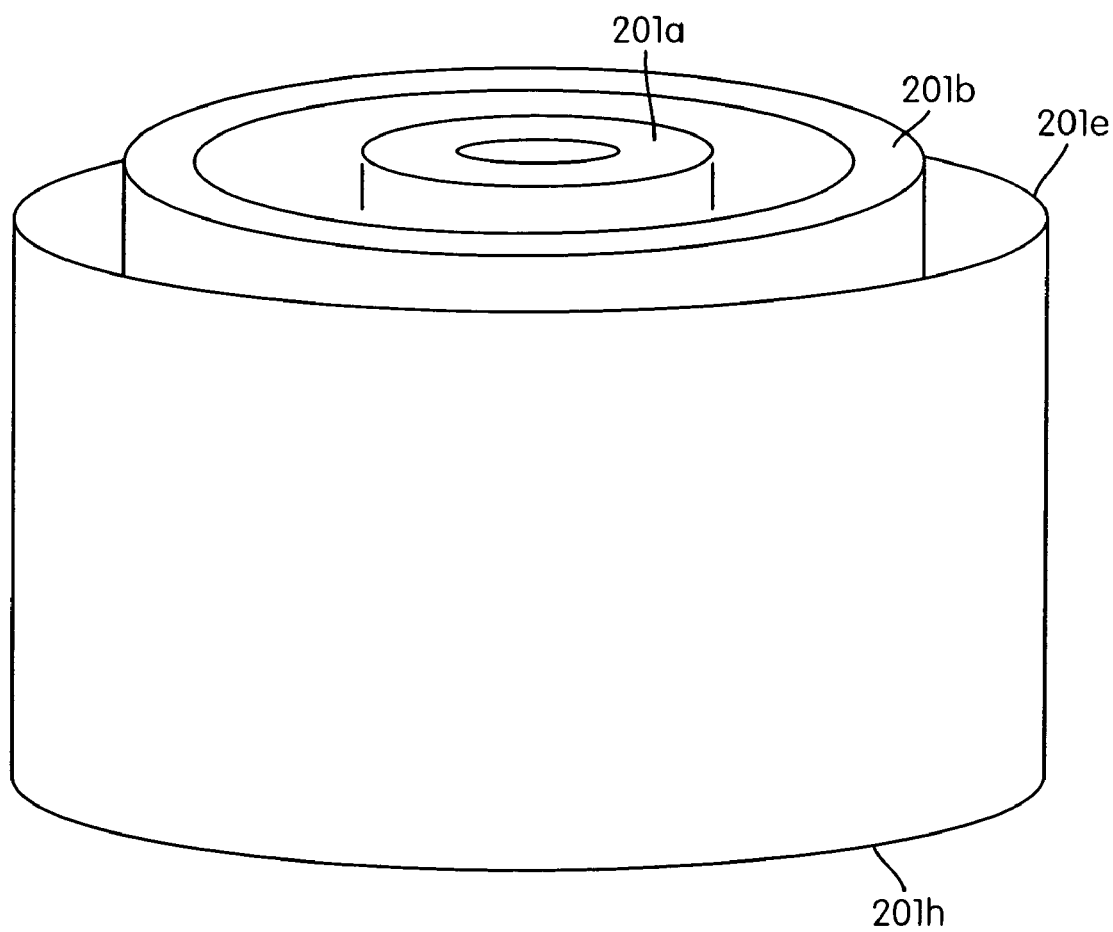

As an alternative to the shielding plates 201d according to FIG. 2a, it is also possible to provide the actuator with a shielding sleeve or shielding can, as is depicted in FIG. 3b.

This has also proven to provide an effective shielding of the field generated by the long stroke actuator 200 with respect to the short stroke actuator 201a. In an embodiment of the invention, in order to improve shielding, the can 201e may include a bottom plate 201g for effective shielding. In the example and dimensions as given with reference to the actuator according to FIG. 2a, the can may have a diameter which is larger than a diameter of the shielded actuator in an embodiment of the invention, the diameter of the shielding being restricted in general by building volume restrictions in the apparatus. In an embodiment of the invention, the can may have a diameter 10 to 50 mm larger than a diameter of the shielded actuator.

The shielding of the actuator 201 can shield a field generated by the long stroke actuator 200 as described above. However, it also has the effect of diminishing a field by the other short stroke actuator 202. In an embodiment of the invention, only the actuator 201 is provided with a shielding as described above, however it is also possible that the actuator 201 as well as the actuator 202 be provided with a shielding according to embodiments of the invention.

Figure 4A:
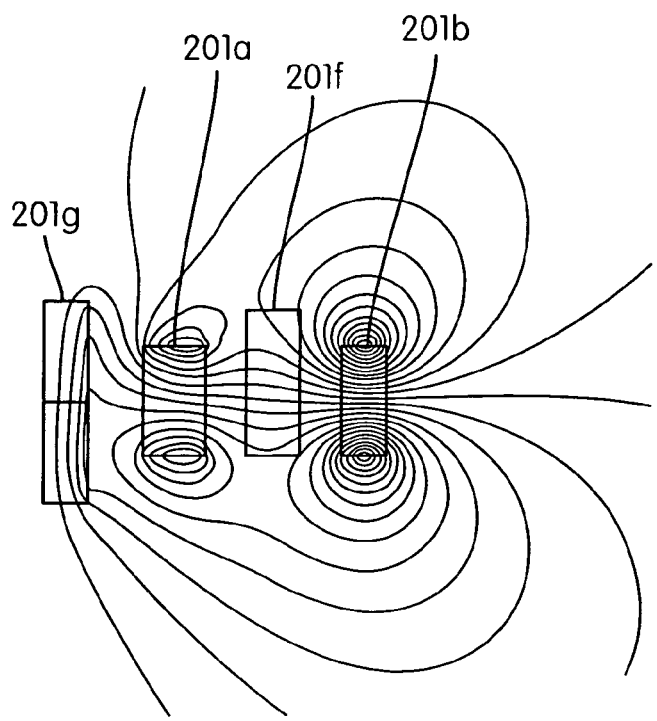
FIGS. 4a and 4b provide a graphical view of field lines in and around an actuator without and with shielding.
Figure 4B:
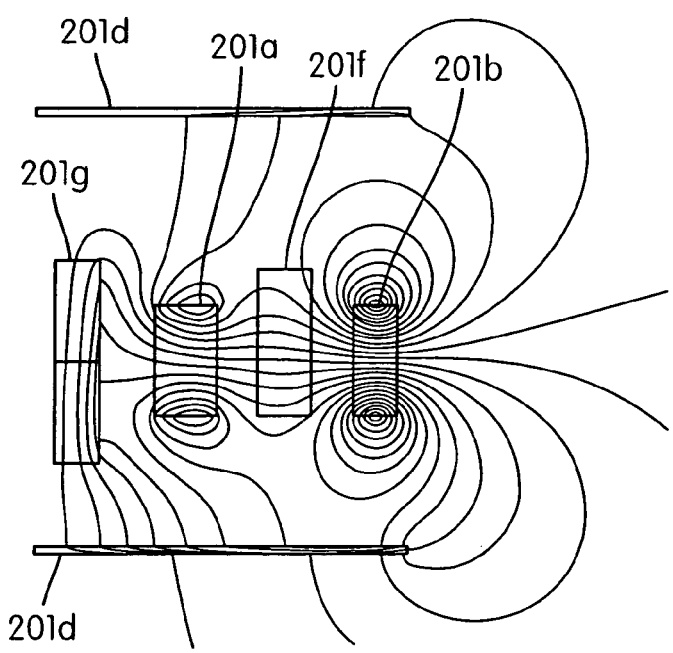

An effect of the shielding will now be described with reference to FIGS. 4a and 4b. FIGS. 4a and 4b show a detailed, cross sectional view of a right side half of the actuator 201 according to FIG. 2 showing a half of the element 201a and a half of the element 201b. Also, FIGS. 4a and 4b indicate further parts, such as a coil 201f and a sensor element 201g which form part of an embodiment of the actuator according to the invention. FIG. 4a, the actuator is shown without shields, while in FIG. 4b the actuator is shown including two shield plates 201d. As can be observed from FIG. 4b, a pattern of field lines is altered with as compared to FIG. 4a.

The positioning system according to embodiments of the invention can not only be applied in a lithographic apparatus, but also in any other positioning system providing similar effects and advantages.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

While specific embodiments of the invention have been described above, it will be appreciated that the invention may be practiced otherwise than as described. The description is not intended to limit the invention.

What is claimed is:

1. A lithographic apparatus comprising:
   an illumination system configured to condition a beam of radiation;
   a support structure configured to support a patterning device, the patterning device serving to impart the beam of radiation with a pattern in its cross-section;
   a substrate table configured to hold a substrate;

a projection system configured to project the patterned beam onto a target portion of the substrate, and a first and a second electromagnetic actuator, each of said first and second electromagnetic actuator comprising two electromagnetic elements that are configured to electromagnetically cooperate to move a first of the two electromagnetic elements with respect to a second of the two electromagnetic elements, wherein the first actuator comprises a movable shield that is configured to shield said first actuator from an electromagnetic field generated by the second actuator or generated by another magnetic part of the apparatus so as to at least partly inhibit a disturbance force due to said electromagnetic field from acting on said first actuator.

2. The lithographic apparatus of claim 1, wherein the second electromagnetic actuator comprises a shield that is configured to shield said second actuator from an electromagnetic field generated by the first actuator or generated by another magnetic part of the apparatus so as to at least partly inhibit a disturbance force due to the electromagnetic field generated by the first actuator or generated by another magnetic part from acting on said second actuator.

3. The lithographic apparatus of claim 1, wherein the electromechanical elements includes a coil, a permanent magnet, a metal, a ceramic, or a plastic for coating.

4. The lithographic apparatus of claim 1, wherein the shield comprises a ferromagnetic material.

5. The lithographic apparatus of claim 4, wherein the shield comprises a steel.

6. The lithographic apparatus of claim 4, wherein the shield comprises a material having a high relative permeability.

7. The lithographic apparatus of claim 6, wherein a value of the relative permeability is greater than about 50,000.

8. The lithographic apparatus of claim 7, wherein a value of the relative permeability is in a range from about 50,000 to 200,000.

9. The lithographic apparatus of claim 1, wherein said first electromagnetic actuator comprises a coaxial assembly of the two mutually cooperating electromagnetic elements, the shield being coaxial with the assembly and located at a distance from the coaxial assembly.

10. The lithographic apparatus of claim 9, wherein the distance is in a range from about 10 mm to 50 mm.

11. The lithographic apparatus of claim 10, wherein the distance is in the range from about 20 mm to 40 mm.

12. The lithographic apparatus of claim 9, wherein the coaxial assembly has an outer diameter in a range from about 50 mm to 100 mm.

13. The lithographic apparatus of claim 12, wherein said outer diameter is substantially 80 mm.

14. The lithographic apparatus of claim 1, wherein the shield comprises a substantially circular plate.

15. The lithographic apparatus of claim 1, wherein the shield comprises a sleeve.

16. The lithographic apparatus of claim 9, wherein a diameter of the shield is approximately equal to a diameter of the coaxial assembly.

17. The lithographic apparatus of claim 1, wherein the shield or a part thereof is mechanically connected to one of the mutually cooperating electromechanical elements of the first electromagnetic actuators.

18. The lithographic apparatus of claim 1, wherein the first electromagnetic actuator is a short stroke module and the second electromagnetic actuator is a long stroke module.

19. A device manufacturing method comprising:
projecting a patterned beam of radiation onto a target portion of the substrate, positioning an object with a first electromagnetic actuator, said first electromagnetic actuator comprising two electromagnetic elements that are configured to electromagnetically cooperate to move a first of the two electromagnetic elements with respect to a second of the two electromagnetic elements, and shielding said first actuator with a movable shield from an electromagnetic field generated by another magnetic part so as to at least partly inhibit a disturbance force due to said electromagnetic field from acting on said first actuator.

20. The method of claim 19, wherein said object includes a substrate, an illumination system or a patterning device.

21. A positioning system comprising:
a first and a second electromagnetic actuator, each of said first and second electromagnetic actuators comprising two mutually cooperating electromagnetic elements that are configured to electromagnetically cooperate to move a first of the two electromagnetic elements with respect to a second of the two electromagnetic elements wherein the first actuator comprises a movable shield that is configured to shield said first actuator from an electromagnetic field generated by the second electromagnetic actuator or generated by another magnetic part so as to at least partly inhibit a disturbance force due to said electromagnetic field from acting on said first actuator.

22. A lithographic apparatus comprising:
an illumination system configured to condition a beam of radiation;

a support structure configured to support a patterning device, the patterning device serving to impart the beam of radiation with a pattern in its cross-section;

a substrate table configured to hold a substrate;

a projection system configured to project the patterned beam onto a target portion of the substrate, and a first and a second electromagnetic actuator, each of said first and second electromagnetic actuator comprising two electromagnetic elements that are configured to electromagnetically cooperate to move a first of the two electromagnetic elements with respect to a second of the two electromagnetic elements, wherein the first actuator comprises a movable shield that is configured to shield said first actuator from an electromagnetic field generated by the second actuator or generated by another magnetic part of the apparatus so as to at least partly inhibit a disturbance force due to said electromagnetic field from acting on said first actuator, and wherein the first and second electromagnetic actuators are cooperable with the substrate table to enable movement of the substrate table.

23. A lithographic apparatus comprising:
an illumination system configured to condition a beam of radiation;

a support structure configured to support a patterning device, the patterning device serving to impart the beam of radiation with a pattern in its cross-section;

a substrate table configured to hold a substrate;

a projection system configured to project the patterned beam onto a target portion of the substrate, and a first and a second electromagnetic actuator, each of said first and second electromagnetic actuator comprising two electromagnetic elements that are configured to electromagnetically cooperate to move a first of the two electromagnetic elements with respect to a second of the two electromagnetic elements, wherein the first actuator comprises a movable shield that is configured to shield said first actuator from an electromagnetic field generated by the second actuator or generated by another magnetic part of the apparatus so as to at least partly inhibit a disturbance force due to said electromagnetic field from acting on said first actuator, and wherein the first and second electromagnetic actuators are cooperable with the support structure to enable movement of the support structure.

24. The lithographic of claim 1, wherein the movable shield is attached to the first of the two electromagnetic elements.

25. The lithographic of claim 1, wherein the movable shield includes a first part attached to the first of the two electromagnetic elements and a second part attached to the second of the two electromagnetic elements.

* * * * *